United States Patent [19]
Werbizky

[11] Patent Number: 4,814,857
[45] Date of Patent: Mar. 21, 1989

[54] CIRCUIT MODULE WITH SEPARATE SIGNAL AND POWER CONNECTORS

[75] Inventor: George G. Werbizky, Vestal, N.Y.

[73] Assignee: International Business Machines Corporation, Armonk, N.Y.

[21] Appl. No.: 18,633

[22] Filed: Feb. 25, 1987

[51] Int. Cl.⁴ .................. H01L 23/02; H01L 23/16; H01L 39/02
[52] U.S. Cl. ........................................ 357/74; 357/75; 357/80
[58] Field of Search ............................ 357/74, 75, 80

[56] References Cited

U.S. PATENT DOCUMENTS

| | | | |
|---|---|---|---|
| 2,995,686 | 8/1961 | Selvin | 317/101 |
| 3,029,495 | 4/1962 | Doctor | 29/155.5 |
| 3,105,868 | 10/1963 | Feigin et al. | 174/68.5 |
| 3,107,414 | 10/1963 | Sterling | 29/155.5 |
| 3,184,649 | 5/1965 | Singletary | 317/101 |
| 3,209,208 | 9/1965 | Francis et al. | 317/100 |
| 3,278,806 | 10/1966 | Cray | 317/100 |
| 3,368,115 | 2/1968 | Hoffman | 317/101 |
| 3,496,283 | 2/1970 | Andrasfay | 174/68.5 |
| 3,614,541 | 10/1971 | Farrand | 317/101 |
| 3,634,602 | 1/1972 | Bruck | 174/68.5 |
| 3,643,135 | 2/1972 | Devore et al. | 317/101 D |
| 3,795,037 | 3/1974 | Luttmer | 29/628 |
| 3,808,506 | 4/1974 | Lang | 317/101 D |
| 3,846,734 | 11/1974 | Pauza et al. | 339/17 C F |
| 3,934,959 | 1/1976 | Gilissen | 339/17 M |
| 3,949,276 | 4/1976 | Reuting | 317/113 |
| 4,074,342 | 2/1978 | Honn et al. | 357/74 |
| 4,076,357 | 2/1978 | Cistola | 339/17 M |
| 4,082,394 | 4/1978 | Gedney et al. | 357/74 |
| 4,103,318 | 7/1978 | Schwede | 361/388 |
| 4,137,559 | 1/1979 | Reuting | 361/331 |
| 4,231,154 | 11/1980 | Gazdik et al. | 357/74 |
| 4,296,456 | 10/1981 | Reid | 357/74 |
| 4,322,778 | 3/1982 | Barbour et al. | 357/74 |
| 4,381,131 | 4/1983 | Demnianiuk | 357/74 |
| 4,628,411 | 12/1986 | Balderes et al. | 361/414 |
| 4,649,417 | 3/1987 | Burgess et al. | 357/80 |
| 4,727,410 | 2/1988 | Higgins, III | 357/74 |

FOREIGN PATENT DOCUMENTS

WO840185 9/1984 PCT Int'l Appl. .

OTHER PUBLICATIONS

Electrical Manufacturing, Doctor et al., Microminiature Components, Aug. 1958, pp. 94–97.
IBM J. Res. & Dev., Seraphim et al., Electronic Packaging Evolution in IBM, vol. 25, No. 5, Sept. 1981, pp. 617–629.
IBM J. Res. & Dev., Blodgett et al., Thermal Conduction Module: A High-Performance Multilayer Ceramic Package, vol. 26, No. 1, Jan. 1982, pp. 30–36.
IBM J. Res. & Dev., Bonner et al., Advanced Printed-Circuit Board Design for High-Performance Computer Applications, vol. 26, No. 3, May 1982, pp. 297–305.
"Pluggable-Module Power-Connection Mechanism-"—IBM Technical Disclosure Bulletin, vol. 27, No. 10A, Mar. 85, pp. 5599–5600.

Primary Examiner—Andrew J. James
Assistant Examiner—Gregory Key
Attorney, Agent, or Firm—Norman R. Bardales; Elmer W. Galbi

[57] ABSTRACT

The present invention provides a pluggable, high density, reliable integrated circuit package. The package has a plurality of integrated circuit chips mounted on a multilayer ceramic substrate. Input-output signals are provided to the module by means of mating male female input-output pins which are located on the bottom of the module. Power is provided to the module from a multilayer ceramic frame through an edge connector that is an integral part of the mulltilayer ceramic substrate. Matching circuit vias located on the edge of the multilayer ceramic substrate and on the edge of the multilayer ceramic frame are cut and tinned with tin-lead to provide power input connections. When the module is plugged into the circuit board the edge connectors on the module mate with the edge connectors in the ceramic frame. Since the frame is made of the same material as the module substrate, the power connectors have excellent thermal match and they are highly reliable.

31 Claims, 2 Drawing Sheets

CIRCUIT MODULE WITH SEPARATE SIGNAL AND POWER CONNECTORS

TECHNICAL FIELD

This invention relates to integrated circuits and more particularly to a high density package for integrated circuits.

BACKGROUND AND PRIOR ART

High speed computers require densely packaged integrated circuit. Such packages must be highly reliable and they must provide for physically supporting, interconnecting, and for cooling the integrated circuits.

Factors that must be considered in the design of high density packages for integrated circuits include: (a) the number of circuits per chip, (b) the number of chip to module interconnections, (c) the chip power requirements and (d) the number of input-output connections provided by the package. Modern digital computers require a packaging technology that provides a relatively large number of integrated circuit chips in a single package and which provides for literally thousands of I-O connections to the package. Furthermore, the I-O pins must be pluggable so that the package can be removed from a circuit board on which the package is mounted. One modern packaging system used in commercially available high speed digital computers is shown in several articles published during 1981 and 1982 in the *IBM Journal of Research and Development*, Volume 25 Number 5, Volume 26 Number 1, and Volume 26 Number 3. In particular see:

(a) An article entitled "Electronic Packaging Evolution in IBM", *IBM Journal of Research and Development*, Volume 25, Number 5 pages 617-629, Sept. 1981 by D. P. Seraphim and I. Feinberg, (b) An article entitled "Advanced Printed Circuit Board Design for High Performance Computer Applications", *IBM Journal of Research and Development*, Volume 26 Number 3, pages 297-305, May 1982, by R. F. Bonner, J. A. Asselta, and F. W. Haining, and (c) An article entitled "Thermal Conduction Module: A High Performance Multilayer Ceramic Package", *IBM Journal of Research and Development*, Volume 26 number 3 Number 1, pages 30-36, Jan. 1982 by A. J. Blodgett and D. R. Barbour.

In the module shown in the above articles, power is supplied to the module through the same type of pins that carry signals to the module. This has at least two disadvantages. First, the design of the pins and the pin connectors must take into account both the requirements of signal connections and the requirements of power connections, thereby limiting the design choices available. Second, any pins used for power connections reduces the number of pins available for signal connections. A large variety of other packages for integrated circuits are known in the art. For example, U.S. Pat. No. 3,846,734 (Pauza) et al. shows an example of a dual in-line circuit package. U.S. Pat. No. 3,808,506 (Lang) shows a package with contact pads on both sides of a block. U.S. Pat. No. 3,614,541 (Farrand) shows a board with connectors on multiple sides. U.S. Pat. No. 4,137,559 (Reuting) shows a package with connectors on multiple sides of the package. Other references of general interest which show the state of the art include U.S. Pat. Nos. 3,634,602 (Bruck), 3,934,959 (Gilissen), 3,795,037 (Luttmer), 3,496,283 (Andrasfay), 3,107,414 (Sterling), 3,105,868 (Feigin) et al., 3,029,495 (Doctor), and 3,643,135 (Devore) et al.

There are known circuit packaging technologies where the power connections are separated from the signal connections. Furthermore, as shown in the previously referenced articles in the *IBM Journal of Research and Development* the use of multilayer ceramic (generally termed MLC) substrates in electronic packages is well known. However, none of the art shows or suggests a structure which has a frame made of MLC and where the power connectors are separated from the signal connectors as with the present invention. Furthermore, none of the known circuit packaging technologies provide the density, reliability and number of I-O connections provided by the present invention.

The present invention also provides an improved edge connector for a multilayer ceramic substrate which is not shown or suggested by the prior art.

OBJECT OF THE INVENTION

An object of the present invention is to provide an improved package for high speed integrated circuit chips.

Another object of the present invention is to provide an improved pluggable package for high speed integrated circuits.

Another object of the present invention is to provide a highly reliable package for high speed integrated circuit chips.

Still another object of the present invention is to provide an improved edge connected for a multilayer ceramic substrate.

Another object of the present invention is to provide a reliable, integrated circuit package which has a large number of input-output pins.

Yet another object of the present invention is to provide a package for integrated circuits where the signal input-output pins are separated from the power pins.

Still another object of the present invention is to provide a package for integrated circuit chips which has signal pins designed to optimize the signal pin requirements and power connections which are designed to optimize the requirements for power connections.

Still another object of the present invention is to provide additional input-output pins on a standard size TCM module.

SUMMARY OF THE INVENTION

The present invention provides a pluggable, high density, reliable integrated circuit package. The package has a plurality of integrated circuit chips mounted on a multilayer ceramic substrate. Input-output signals are provided to the module by means of mating male female input-output pins. Power is provided to the module by a separate set of connector.

Male signal input-output pins are brazed to the bottom layer of MLC circuitry in a conventional manner. These pins plug into female connectors which are located on a circuit board.

Power is provided to the module from a multilayer ceramic frame through an edge connector that is an integral part of the multilayer ceramic substrate. Matching circuit vias located on the edge of the multilayer ceramic substrate and on the edge of the multilayer ceramic frame are cut and tinned with tin-lead to provide power input connections. When the module is plugged into the circuit board the edge connectors on the module mate with the edge connectors in the ceramic frame.

Input-output signals are provided to the module by means of the input-output pins located on the bottom of the module and power is provided to the module by means of the mating connectors on the sides of the module. Since the frame is made of the same material as the module substrate, the power connectors have excellent thermal match and they are highly reliable.

DETAILED DESCRIPTION

Figure 1:
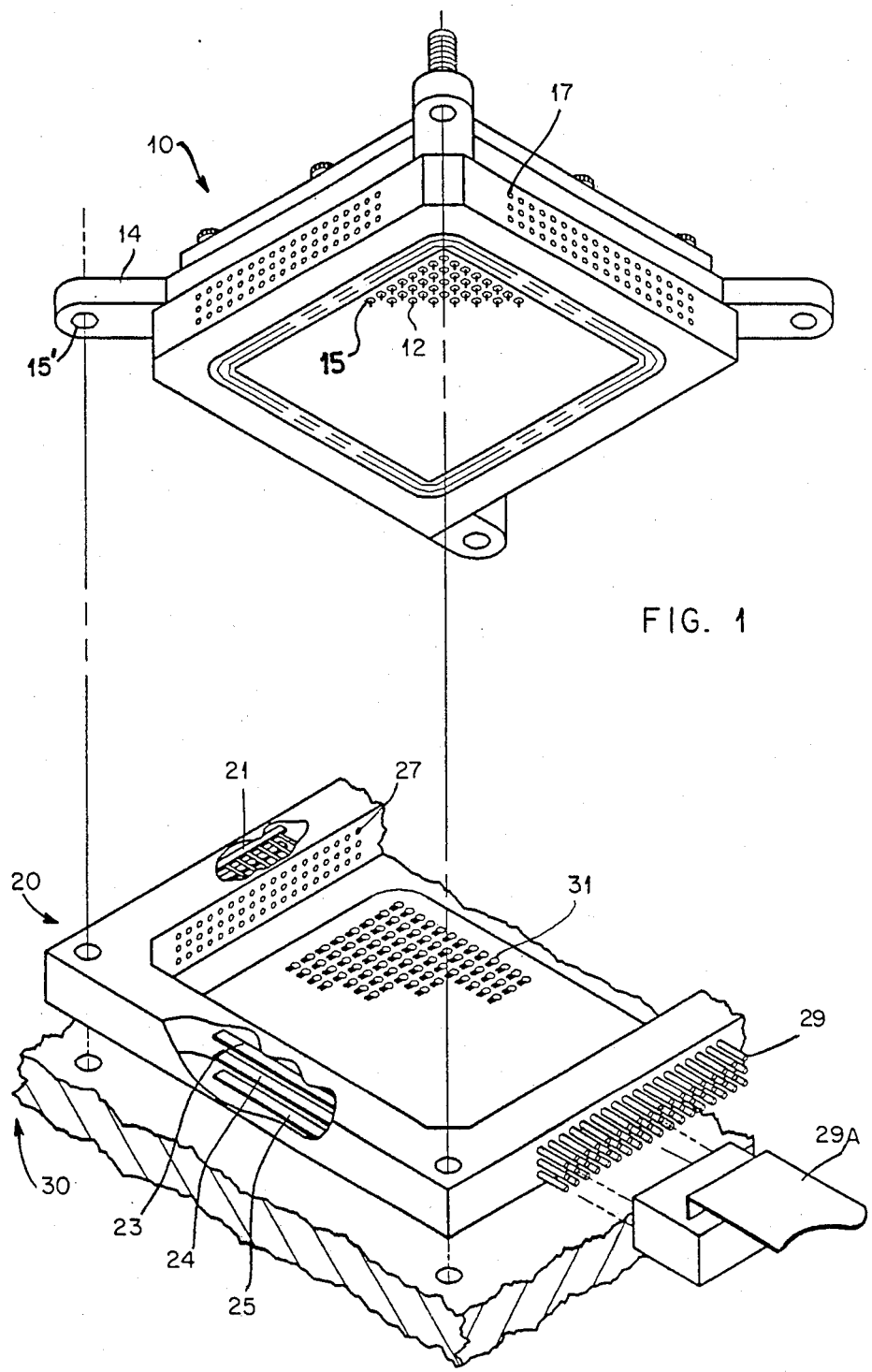
FIG. 1 is an exploded perspective view of an integrated circuit package built in accordance with the present invention.

An overall exploded perspective view of a circuit package built in accordance with the present invention is shown in FIG. 1. The package includes a circuit module 10, a retained frame 20 and a multilayer circuit board 30.

The structure of module 10 is not shown or explained in detail herein since the module 10 is a modification of the integrated circuit module shown in an article by A.J. Blodgett and D.R. Barbour in the Jan. 1982 issue of the *IBM Journal of Research and Development*, Volume 26 Number 1, pages 30-36. The details of how the module is constructed other than as described herein are not particularly relevant to the present invention; however, for completeness the description of the module in the above cited article is hereby incorporated herein by reference.

The package shown in the above article is termed a Thermal conduction Module (abbreviated TCM). It utilizes a 99×99 mm multilayer ceramic substrate to interconnect up to 100 logic chips each of which have up to 704 circuits per chip. The module has 1800 pins brazed to the back side of the substrate and it connects to a circuit board through a connector assembly.

The 90 mm substrate consists of up to 33 layers of molybdenum metalized alumina. These layers provide for power distribution, impedance controlled interconnection of up to 12000 chip pads, and for wiring to the 1800 module pins. A typical substrate contains 350,000 vias for layer to layer connections and 130 meters of x-y wiring. The total substrate thickness is approximately 5.5 mm.

Module 10 includes a plurality of input output pins 12 which are brazed to circuitry at points 15. This is conventional and is as shown in the above cited Blodgett et al. article in the *IBM Journal of Research and Development*. It is noted that the pins 12 cover the entire under surface of the module 10 as shown in the above cited reference. FIG. 1 only shows a few of the pins for each of illustration. Module 10 also has a plurality of power connectors 17 on three sides of module 10. These connectors are not part of the module shown in the above referenced article and there structure will be explained in detail later with reference to FIGS. 2 and 3.

Figure 2:
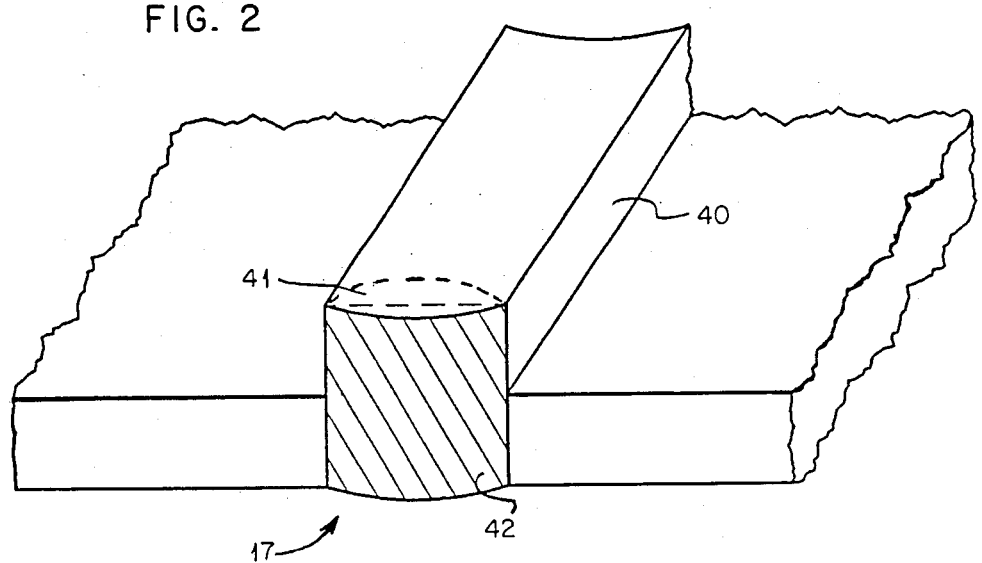
FIG. 2 is a perspective view of an edge connector on a module built in accordance with the present invention.
Figure 3:
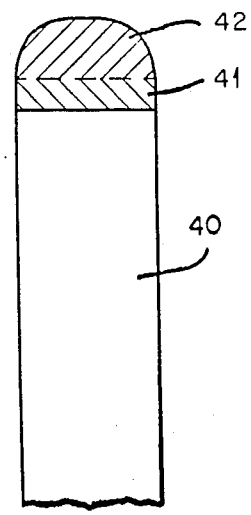
FIG. 3 is a top view of an edge connector on a module built in accordance with the present invention.

Multilayer ceramic frame 20 has power connectors 27 on three sides thereof corresponding to the sides of module 10 which have connectors 17. The structure of multilayer ceramic frame 20 and of connectors 27 will be described in detail layer with respect to FIGS. 2 and 3. A metal support frame 14 which has bolt holes 15' is adapted to hole the entire assembly together. Module 10 includes a plurality of integrated circuit chips (not shown) mounted on a multilayer ceramic substrate. A portion of the multilayer ceramic substrate in module 10 is shown in FIGS. 2 and 3 and it will be described in detail later.

The retainer 20 is made of multilayer ceramic and it has three rows of connectors 27 which are positioned to mate with connectors 17 on module 10. Three rows of circuitry 23, 24 and 25 in frame 20 interconnect the three rows of connectors 27. Circuit lines 21 connect the rows of circuitry 23, 24 and 25 to the connectors 27. It is noted that in FIG. 1, the top layers of frame 20 are shown cut away so that the circuitry 21, 23, 24, and 25 can be shown. Pins 29 are connected to circuit lines 23, 24 and 25 using the same technique that is used to braze pins 12 to the circuitry on module 10. Pins 29 plug into a standard connector 29A which supplies power to the frame.

Multilayer circuit board 30, only a portion of which is shown, includes a plurality of female connectors 31 which are positioned to mate with pins 12 on module 10. Multilayer circuit board 30 is conventional and is similar to the board shown in the previously referenced *IBM Journal of Research and Development* article by Bonner et al. The multilayer ceramic module 10 and the multilayer ceramic frame 20 are built using the same technology used to build conventional multilayer ceramic circuitry. The basic building block used in the multilayer ceramic process is ceramic "green sheets". These sheets consist of a mixture of ceramic and glass powder suspended in an organic binder. They are nominally 0.2 mm or 0.28 mm thick prior to being fired.

The green sheets are metalized in the desired patterns by screen printing with a molybdenum powder which is dispersed in a resin and solvent mixture. Following the screening operation the sheets are dried and stacked. The stacked sheets are laminated and sheared to the desired shape and then sintered. This process is conventional and is described in the literature.

The details of the connectors 17 on module 10 are shown in FIGS. 2 and 3. FIG. 2 shows one circuit line 40 in the multilayer ceramic substrate in module 10. Circuit line 40 extends to the edge of the ceramic substrate and a through hole via 41 is located at the edge of the ceramic substrate. The via 41 is positioned such that it is cut in half when the stacked sheets are sheared to the final desired shape.

With the present invention the process of building multilayer ceramic module 10 and multilayer ceramic frame 20 is identical to the conventional multilayer ceramic process except that a conductive via is located at the edge of the ceramic substrate at each point where one desires a connector 17 or 27. These vias are positioned such that they are cut in half when the ceramic substrate is cut to the required size.

As shown in FIG. 3, the exposed edge 42 of the conductive via is "tinned" with a tin-lead composition to form the connector 17. This tinning can be done by dipping the edge of the substrate in a molten tin-lead bath. The tin-lead will only adhere to the exposed conductive via.

The connectors 27 on frame 20 are formed in the same way. That is, frame 20 is a multilayer ceramic structure with at least three circuit layers. Lines on these circuits are brought out to form connectors 27 in the same way that connectors 17 are formed on module 10 as shown in FIGS. 2 and 3. It is noted that the lines 23, 24, 25 and 26 shown in FIG. 1 are shown schematically in FIG. 1 for ease of drawing and clarity of explanation. In fact lines 23, 24, 25 and 26 are circuit lines in a multilayer ceramic circuit structure.

A large variety of alternatively structures are possible without departing from the spirit of the present invention. While the invention has been particularly shown and described with reference to a preferred embodiment thereof, it will be understood by those skilled in the art that various changes in form and details may be made therein without departing from the spirit and scope of the invention.

I claim:

1. Connector apparatus comprising in combination:
    a planar multilayer ceramic substrate first member having
        planar outer first and second opposite surfaces and at last one outer edge third surface therebetween,
        a plurality of planar inner conductive circuit pattern layers disposed between said first and second surfaces, and at least one of said first and second surfaces having disposed thereon an outer conductive circuit pattern layer,
        a plurality of conductive vias within said substrate member for selectively interconnecting said conductive circuit partner layers,
        a plurality of conductive pins extending outwardly from one of said first and second surfaces, said pins being connected to preselected ones of said circuit pattern layers, and
        at least one of said inner conductive circuit pattern layers having plural conductors extended to said third surface and having the ends thereof exposed outwardly thereat; and
    a ceramic second member having
        opposite outer fourth and fifth surfaces, said first and second members having their respective said third and fourth surfaces juxtaposed adjacent to each other, at least one inner conductive circuit pattern layer, said inner conductive circuit pattern layer of said second member having plural conductors extended to said fourth surface and having the ends thereof exposed outwardly thereat, said ends of said plural conductors of said first member being mated with said ends of said plural conductors of said second member, and
        a plurality of connector means disposed at said fifth surface and connected to said circuit pattern layer of said second member;
    said circuit pattern layers of said first and second members being substantially parallel to a common reference plane.

2. Connector apparatus comprising in combination:
    a planar multilayer ceramic substrate first member having
        planar outer first and second opposite surfaces and at least one outer edge third surface therebetween, a plurality of planar inner conductive circuit pattern layers disposed between said first and second surfaces, and at least one of said first and second surfaces having disposed thereon an outer conductive circuit pattern layer,
        a plurality of conductive vias within said substrate member for selectively interconnecting said conductive circuit pattern layers,
        a plurality of conductive pins extending outwardly from one of said first and second surfaces, said pins being connected to preselected ones of said circuit pattern layers, and
        at least one of said inner conductive circuit pattern layers having plural conductors extended to said third surface and having the ends thereof exposed outwardly thereat; and
    a ceramic second member having
        opposite outer fourth and fifth surfaces, said first and second members having their respective said third and fourth surfaces juxtaposed adjacent to each other, at least one inner conductive circuit pattern layer, said inner conductive circuit pattern layer of said second member having plural conductors extended to said fourth surface and having the ends thereof exposed outwardly thereat, said ends of said plural conductors of said first member being mated with said ends of said plural conductors of said second member, and
        a plurality of connector means disposed at said fifth surface and connected to said circuit pattern layer of said second member, said connector means being elongated other pins extending outwardly from said fifth surface.

3. Apparatus according to claim 2 wherein said ceramic first and second members are made of substantially the same material.

4. Apparatus according to claim 2 wherein each of said ends of said conductors of at least one of said first and second members are terminated with a cut conductive via.

5. Apparatus according to claim 4 wherein each of said cut conductive vias has an outer cut surface having a solder coating thereon.

6. Connector apparatus comprising in combination:
    a planar multilayer ceramic substrate first member having
        planar outer first and second opposite surfaces and at least one outer edge third surface therebetween,
        a plurality of planar inner conductive circuit pattern layers disposed between said first and second surfaces, and at least one of said first and second surfaces having disposed thereon an outer conductive circuit pattern layer,
        a plurality of conductive vias within said substrate member for selectively interconnecting said conductive circuit pattern layers,
        a plurality of conductive pins extending outwardly from one of said first and second surfaces, said pins being connected to preselected ones of said circuit pattern layers, and
        a predetermined plural number of said inner conductive circuit pattern layers having plural conductors extended to said third surface and having the ends thereof exposed outwardly thereat; and
    a multilayer ceramic second member having
        opposite outer fourth and fifth surfaces, said first and second members having their respective said third and fourth surfaces juxtaposed adjacent to each other, a plural corresponding said number of inner conductive circuit pattern layers, said inner conductive circuit pattern layers of said second member having plural conductors extended to said fourth surface and having the ends thereof exposed outwardly thereat, said ends of said plural conductors of said first member being mated with said ends of said plural conductors of said second member, and a plurality of connector means disposed at said fifth surface and connected to said circuit pattern layers of said second member;

said circuit pattern layers of said first and second members being substantially parallel to a common reference plane.

7. Connector apparatus comprising in combination:

a planar multilayer ceramic substrate first member having planar outer first and second opposite surfaces and at least one outer edge third surface therebetween, a plurality of planar inner conductive circuit pattern layers disposed between said first and second surfaces, and at least one of said first and second surfaces having disposed thereon an outer conductive circuit pattern layer, a plurality of conductive vias within said substrate member for selectively interconnecting said conductive circuit pattern layers, a plurality of conductive pins extending outwardly from one of said first and second surfaces, said pins being connected to preselected ones of said circuit pattern layers, and a predetermined plural number of said inner conductive circuit pattern layers having plural conductors extended to said third surface and having the ends thereof exposed outwardly thereat; and a multilayer ceramic second member having opposite outer fourth and fifth surfaces, said first and second members having their respective said third and fourth surfaces juxtaposed adjacent to each other, a plural corresponding said number of inner conductive circuit pattern layers, said inner conductive circuit pattern layers of said second member having plural conductors extended to said fourth surface and having the ends thereof exposed outwardly thereat, said ends of said plural conductors of said first member being mated with said ends of said plural conductors of said second member, and a plurality of connector means disposed at said fifth surface and connected to said circuit pattern layers of said second member, said connector means being elongated other pins extending outwardly from said fifth surface.

8. Apparatus according to claim 7 wherein said ceramic first and second members are made of substantially the same material.

9. Apparatus according to claim 7 wherein each of said ends of said conductors of at least one of said first and second members are terminated with a cut conductive via.

10. Apparatus according to claim 9 wherein each of said cut conductive vias has an outer cut surface having a solder coating thereon.

11. Integrated circuit package apparatus comprising in combination:

at least one integrated circuit chip having plural input/output terminals;

a planar multilayer ceramic substrate first member having planar outer first and second opposite surfaces and at least one outer edge third surface therebetween, a plurality of planar inner conductive circuit pattern layers disposed between said first and second surfaces, and said first surface having disposed thereon an outer conductive circuit pattern layer, said integrated circuit chip being mounted to said first surface and having said input/output terminals connected to said outer conductive circuit pattern layer thereof, a plurality of conductive vias within said substrate member for selectively interconnecting said conductive circuit pattern layers, a plurality of conductive pins extending outwardly from said second surface, said pins being connected to preselected ones of said circuit pattern layers, and at least one of said inner conductive circuit pattern layers having plural conductor extended to said third surface and having ends thereof exposed outwardly thereat; and a ceramic second member having opposite outer fourth and fifth surfaces, said first and second members having their respective said third and fourth surfaces juxtaposed adjacent to each other, at least one inner conductive circuit pattern layer, said inner conductive circuit pattern layer of said second member having plurality conductors extended to said fourth surface and having the ends thereof exposed outwardly thereat, said ends of said plural conductors of said first member being mated with said ends of said plural conductors of said second member, and a plurality of connector means disposed at said fifth surface and connected to said circuit pattern layer of said second member;

preselected ones of said input/output terminals of said chip being interconnected by said interconnected circuit pattern layers to said connector means, and the other of said input/output terminals of said chip being interconnected by said interconnected circuit pattern layers of said first member to said pins, said circuit pattern layers of said first and second members being substantially parallel to a common reference plane.

12. Integrated circuit package apparatus comprising in combination:

at least one integrated circuit chip having plural input/output terminals;

a planar multilayer ceramic substrate first member having planar outer first and second opposite surfaces and at least one outer edge third surface therebetween, a plurality of planar inner conductive circuit pattern layers disposed between said first and second surfaces, and said first surface having disposed thereon an outer conductive circuit pattern layer, said integrated circuit chip being mounted to said first surface and having said input/output terminals connected to said outer conductive circuit pattern layer thereof, a plurality of conductive vias within said substrate member for selectively interconnecting said conductive circuit pattern layers, a plurality of conductive pins extending outwardly from said second surface, said pins being connected to preselected ones of said circuit pattern layers, and at least one of said inner conductive circuit pattern layers having plural conductors extended to said third surface and having the ends thereof exposed outwardly threat; and a ceramic second member having
opposite outer fourth and fifth surfaces, said first and second members having their respective said third and fourth surfaces juxtaposed adjacent to each other, at least one inner conductive circuit pattern layer, said inner conductive circuit pattern layer of said second member having plural conductors extended to said fourth surface and having the ends thereof exposed outwardly thereat, said ends of said plural conductors of said first member being mated with said ends of said plural conductors of said second member, and a plurality of connector means disposed at said fifth surface and connected to said circuit pattern layer of said second member;

preselected ones of said input/output terminals of said chip being interconnected by said interconnected circuit pattern layers to said connector means, and the other of said input/output terminals of said chip being interconnected by said interconnected circuit pattern layers of said first member to said pins, said connector means being elongated other pins extending outwardly from said fifth surface.

13. Apparatus according to claim 12 wherein said ceramic first and second members are made of substantially the same material.

14. Apparatus according to claim 12 wherein each of said ends of said conductors of at least one of said first and second members are terminated with a cut conductive via.

15. Apparatus according to claim 14 wherein each of said cut conductive vias has an outer cut surface having a solder coating thereon.

16. Apparatus according to claim 12 wherein said apparatus further comprises:
a printed circuit board, said printed circuit board having
first socket means; and
at least one electrical connector having second socket means;
said pins extending from said second surface of said first member being plugged into said first socket means of said printed circuit board, and said other pins extending from said fifth surface of said second member being plugged into said second socket means of said at least one electrical connector.

17. Apparatus according to claim 16 wherein input/output data signals for/from said chip are passed through said first socket means, and power signals for said chip are passed through said second socket means.

18. Integrated circuit package apparatus comprising in combination:
a plurality of integrated circuit chips, each of said chips having plural input/output terminals;
a planar multilayer ceramic substrate first member having
planar outer first and second opposite surfaces and at least one outer edge third surface therebetween,
a plurality of planar inner conductive circuit pattern layers disposed between said first and second surfaces, said first surface having disposed thereon an outer conductive circuit pattern layer, said integrated circuit chips being mounted to said first surface and having said input/output terminals connected to said outer conductive circuit pattern layer thereof,
a plurality of conductive vias within said substrate member for selectively interconnecting said conductive circuit pattern layers,
a plurality of conductive pins extending outwardly from said second surface, said pins being connected to preselected ones of said circuit pattern layers, and
a predetermined plural number of said inner conductive circuit pattern layers having plural conductors extended to said third surface and having the ends thereof exposed outwardly thereat; and
a ceramic second member having
opposite outer fourth and fifth surfaces, said first and second members having their respective said third and fourth surfaces juxtaposed adjacent to each other, a plural corresponding said number of inner conductive circuit pattern layers,
said inner conductive circuit pattern layers of said second member having plural conductors extended to said fourth surface and having the ends thereof exposed outwardly thereat, said ends of said plural conductors of said first member being mated with said ends of said plural conductors of said second member, and
a plurality of connector means disposed at said fifth surface and connected to said circuit pattern layers of said second member;
preselected ones of said input/output terminals of said chips being interconnected by said interconnected circuit pattern layers to said connector means, and the other of said input/output terminals of said chips being interconnected by said interconnected circuit pattern layers of said first member to said pins, said circuit pattern layers of said first and second members being substantially parallel to a common reference plane.

19. Integrated circuit package apparatus comprising in combination:
a plurality of integrated circuit chips, each of said chips having plural input/output terminals;
a planar multilayer ceramic substrate first member having
planar outer first and second opposite surfaces and at least one outer edge third surface therebetween,
a plurality of planar inner conductive circuit pattern layers disposed between said first and second surfaces, said first surface having disposed thereon an outer conductive circuit pattern layer, said integrated circuit chips being mounted to said first surface and having said input/output terminals connected to said outer conductive circuit pattern layer thereof,
a plurality of conductive vias within said substrate member for selectively interconnecting said conductive circuit pattern layers,
a plurality of conductive pins extending outwardly from said second surface, said pins being connected to preselected ones of said circuit pattern layers, and a predetermined plural number of said inner conductive circuit pattern layers having plural conductors extended to said third surface and having the ends thereof exposed outwardly thereat; and a ceramic second member having
opposite outer fourth and fifth surfaces, said first and second members having their respective said third and fourth surfaces juxtaposed adjacent to each other, a plural corresponding said number of inner conductive circuit pattern layers,
said inner conductive circuit pattern layers of said second member having plural conductors extended to said fourth surface and having the ends thereof exposed outwardly thereat, said ends of said plural conductors of said first member being mated with said ends of said plural conductors of said second member, and
a plurality of connector means disposed at said fifth surface and connected to said circuit pattern layers of said second member;
preselected ones of said input/output terminals of said chips being interconnected by said interconnected circuit pattern layers to said connector means, and the other of said input/output terminals of said chips being interconnected by said interconnected circuit pattern layers of said first member to said pins, said connector means being elongated other pins extending outwardly from said fifth surface.

20. Apparatus according to claim 19 wherein said ceramic first and second members are made of substantially the same material.

21. Apparatus according to claim 19 wherein each of said ends of said conductors of at least one of said first and second members are terminated with a cut conductive via.

22. Apparatus according to claim 21 wherein each of said cut conductive vias has an outer cut surface having a solder coating thereon.

23. Apparatus according to claim 19 wherein said apparatus further comprises:
a printed circuit board, said printed circuit board having first socket means; and
at least one electrical connector having second socket means;
said pins extending from said second surface of said first member being plugged into said first socket means of said printed circuit board, and said other pins extending from said fifth surface of said second member being plugged into said second socket means of said at least one electrical connector.

24. Apparatus according to claim 23 wherein input/output data signals for/from said chips are passed through said first socket means, and power signals for said chips are passed through said second socket means.

25. Integrated circuit package apparatus comprising in combination:
a plurality of integrated circuit chips, each of said chips having plural input/output terminals,
a planar multilayer ceramic rectangular substrate first member having
planar outer first and second opposite parallel surfaces and four outer edge third surfaces between and orthogonal to said first and second surfaces, a plurality of planar inner conductive circuit pattern layers disposed between said first and second surfaces, said first surface having disposed thereon an outer conductive circuit pattern layer, said integrated circuit chips being mounted to said first surface and having said input/output terminals connected to said outer conductive circuit pattern layer thereof,
a plurality of conductive vias within said substrate member for selectively interconnecting said conductive circuit pattern layers,
a plurality of conductive pins extending outwardly from said second surface, said pins being connected to preselected ones of said circuit pattern layers, and a predetermined plural number of said inner conductive circuit pattern layers having plural conductors extended to three of said third surfaces and having the ends thereof exposed outwardly thereat; and
a ceramic second member having a compatible rectangular opening therethrough for receiving therein said first member, said rectangular opening having four wall fourth surfaces, said second member having four outer fifth surfaces, each of said fourth surfaces being opposite a mutually exclusive one of said fifth surfaces, said first member when received in said opening having the respective third surfaces thereof juxtaposed to a mutually exclusive one of said fourth surfaces, said second member further having
a plural corresponding said number of inner conductive circuit pattern layers,
said inner conductive circuit pattern layers of said second member having plural conductors extended to three of said fourth surfaces and having the ends thereof exposed outwardly thereat, said three fourth surfaces being juxtaposed to said three third surfaces when said first member is received in said opening, each of said ends at said three third surfaces of said first member being mated with a mutually exclusive one of said ends at said three fourth surfaces, and a plurality of connector means disposed at at least one of said fifth surfaces and connected to said circuit pattern layers of said second member,
preselected ones of said input/output terminals of said chips being interconnected by said interconnected circuit pattern layers to said connector means, and the other of said input/output terminals of said chips being interconnected by said interconnected circuit pattern layers of said first member to said pins.

26. Apparatus according to claim 25 wherein said ceramic first and second members are made of substantially the same material.

27. Apparatus according to claim 25 wherein each of said ends of said conductors of said first and second members are terminated with a cut conductive via.

28. Apparatus according to claim 27 wherein each of said cut conductive vias has an outer cut surface having a solder coating thereon.

29. Apparatus according to claim 25 wherein said connector means are elongated other pins extending outwardly from said fifth surface.

30. Apparatus according to claim 29 wherein said apparatus further comprises:
a printed circuit board, said printed circuit board having first socket means; and
at least one electrical connector having second socket means;
said pins extending from said second surface of said first member being plugged into said first socket means of said printed circuit board, and said other pins extending from said fifth surface of said second member being plugged into said second socket means of said at least one electrical connector.

31. Apparatus according to claim 30 wherein input/output data signals for/from said chips are passed through said first socket means, and power signals for said chips are passed through said second socket means.

* * * * *